(12) United States Patent
Ahmed et al.

(10) Patent No.: US 11,798,816 B2
(45) Date of Patent: Oct. 24, 2023

(54) METHOD FOR ISOLATING A CONDUCTIVE VIA FROM A GLASS SUBSTRATE

(71) Applicant: University of Central Florida Research Foundation, Inc., Orlando, FL (US)

(72) Inventors: Omar Saad Ahmed, Orlando, FL (US); Tengfei Jiang, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 182 days.

(21) Appl. No.: 17/333,373

(22) Filed: May 28, 2021

(65) Prior Publication Data
US 2021/0407820 A1 Dec. 30, 2021

Related U.S. Application Data

(60) Provisional application No. 63/043,989, filed on Jun. 25, 2020.

(51) Int. Cl.
| | |
|---|---|
| *H01L 21/48* | (2006.01) |
| *H01L 21/66* | (2006.01) |
| *H01L 23/15* | (2006.01) |
| *H01L 23/498* | (2006.01) |

(52) U.S. Cl.
CPC ........ *H01L 21/486* (2013.01); *H01L 21/4864* (2013.01); *H01L 22/32* (2013.01); *H01L 23/15* (2013.01); *H01L 23/49827* (2013.01)

(58) Field of Classification Search
CPC ... H01L 21/486; H01L 21/4864; H01L 22/32; H01L 23/15; H01L 23/49827; C03C 2218/34; C03C 15/00
USPC ....................................................... 438/667
See application file for complete search history.

(56) References Cited

U.S. PATENT DOCUMENTS

| | | | | |
|---|---|---|---|---|
| 5,348,616 | A * | 9/1994 | Hartman | G02B 6/10 |
| | | | | 216/75 |
| 10,575,397 | B1 * | 2/2020 | Lin | H01L 24/32 |
| 2013/0194537 | A1 * | 8/2013 | Mao | G02B 6/356 |
| | | | | 349/196 |
| 2014/0225079 | A1 * | 8/2014 | Lee | H01L 51/0058 |
| | | | | 257/40 |
| 2017/0181280 | A1 * | 6/2017 | Asano | H05K 1/0306 |
| 2020/0286819 | A1 * | 9/2020 | Kim | H01L 21/486 |

OTHER PUBLICATIONS

Ahmed et al., "Micro-Compression of Freestanding Electroplated Copper Through-Glass Vias", IEEE Transactions on Device and Materials Reliability, Mar. 2020, pp. 199 through 203, vol. 20, No. 1, IEEE.

Corning, "Eagle XG Slim Glass—Product Information Sheet", Corning Display Technologies, Aug. 2013, pp. 1 through 2, Corning Incorporated.

(Continued)

*Primary Examiner* — Duy T Nguyen
(74) *Attorney, Agent, or Firm* — Fogg & Powers LLC

(57) ABSTRACT

A method for isolating at least one conductive via from a surrounding glass substrate is provided. A support layer is formed over at least one surface of the glass substrate. Thereafter, the glass substrate is removed. As a result, the at least one conductive via can be analyzed without interference from the glass substrate.

12 Claims, 2 Drawing Sheets

(56) References Cited

OTHER PUBLICATIONS

Figure 1:
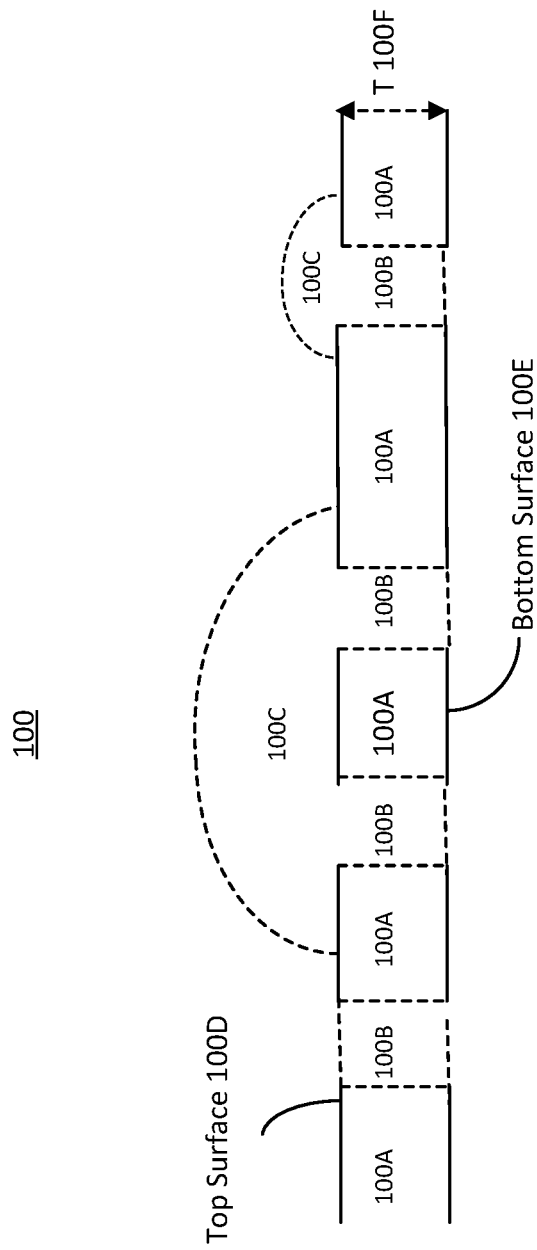

Gu et al., "Mechanical property evaluation of TSV-Cu micropillar by compression method", Electron. Mater. Lett., Jul. 10, 2014, pp. 851 through 855, vol. 10, No. 4.

Hirouchi et al., "Mechanical Responses of Copper Bicrystalline Micro Pillars with & Sigma; 3 Coherent Twin Boundaries by Uniaxial Compression Tests", Materials Transactions, Special Issue on Strength of Fine Grained Materials—60 Years of Hall-Petch, Nov. 1, 2013, pp. 52 through 57, vol. 55, No. 1, the Japan Institute of Metals and Materials.

Howard et al., "Investigation of specimen size effects by in-situ microcompression of equal channel angular pressed copper". Materials Science & Engineering A 649 (2016), Sep. 30, 2015, pp. 104-113, Elsevier.

Hutsch et al., "The influence of focused-ion beam preparation technique on microcompression investigations: Lathe vs. annular milling", Scripta Materialia 77 (2014), Jan. 24, 2014, pp. 49-51, Elsevier.

Kempshall et al., "Ion channeling effects on the focused ion beam milling of Cu", Journal of Vacuum Science & Technology B: Microelectronics and Nanometer Structures Processing, Measurement, and Phenomena 19(3), 749(2001), May/Jun. 2001, pp. 749 through 754, American Vacuum Society.

Lee et al., "Sample size effect and microcompression of Mg65Cu25Gd10 metallic glass", Applied Physics Letters 91, 161913, Oct. 19, 2007, pp. 1 through 4, American Institute of Physics.

Nagoshi et al., "Mechanical behavior of a microsized pillar fabricated from ultrafine-grained ferrite evaluated by a microcompression test", Acta Materialia 73, Apr. 24, 2014, pp. 12 through 18, Elsevier.

Uchic et al., "Micro-Compression Testing of fcc Metals: a Selected Overview of Experiments and Simulations", Nanomechanical Characterization, Mar. 2009, pp. 36 through 41, JOM, www.tms.org/jom.html.

Zhang et al., "The design of accurate micro-compression experiments", Scripta Materialia 54 (2006), Oct. 21, 2005, pp. 181 through 186, Acta Materialia Inc., Elsevier Ltd.

* cited by examiner

METHOD FOR ISOLATING A CONDUCTIVE VIA FROM A GLASS SUBSTRATE

CROSS-REFERENCE TO RELATED APPLICATIONS

The present application claims benefit of U.S. Patent Application Ser. No. 63/043,989, filed Jun. 25, 2020; the entire contents of the aforementioned patent application are incorporated herein by reference as if set forth in its entirety.

U.S. GOVERNMENT LICENSE RIGHTS

This invention was made with Government support under Award No. 1439680 awarded by National Science Foundation. The Government has certain rights in the invention.

BACKGROUND

Integrated circuit(s) (IC(s)) and/or discrete component(s), e.g., transistor(s), semiconductor laser(s), capacitor(s), inductors, and/or resistors, may be mounted on a glass substrate. Further, electrical interconnects between such ICs, discrete components, input/output(s) (I/O(s)) may be formed with conductor(s), e.g., metal(s) and/or metal alloy(s), in or on the glass substrate. Because glass is an electrical insulator, the glass substrate electrically isolates such IC(s) and discrete component(s) from one another. A glass substrate mounted with IC(s) and/or discrete components may be used for a computing device and display (e.g., for augmenting reality), for an imaging device, e.g., a camera, and/or as an insulating substrate in other types of systems using electronic components.

The thermal coefficient of expansion of the glass substrate can be varied by modifying materials, e.g., dopants, used to form the glass substrate. Thus, glass substrates may be formed that have thermal coefficients of expansion that substantially match the thermal coefficients of expansion of the components mounted on the glass substrate and conductive vias in the glass substrate. As a result, the glass substrates can also be used in systems exposed to a wide range of temperature.

The glass substrate may include one or more conductive vias (conductive via(s)). The conductive via(s) may be used to provide an electrical connection from one side of the glass substrate to the opposite side of the glass substrate. Thus, the conductive via(s) may be used to couple portion(s) of the IC(s) and/or discrete semiconductor component(s) to an electrical potential, e.g., ground, and/or to other component(s) on or off the glass substrate. Thus, the conductive via(s) can be used to supply a voltage, a ground potential, and/or electrical signal(s).

It is desirable to characterize the mechanical properties of the conductor which fills the via hole to confirm that they are sufficiently robust. However, the glass substrate interferes with such analysis.

SUMMARY

A method, of preparing a glass substrate with at least one through glass conductive via to facilitate testing of a conductive via, is provided. The method comprises: forming a support layer over at least one surface of the glass substrate and an exposed surface of a conductor of each conductive via, or over the at least one surface of the glass substrate and the exposed surface of the conductor of each conductive via, and a surface of at least one overburden; upon forming the support layer, removing the glass substrate from the glass substrate with at least one through glass conductive via.

DRAWINGS

Figure 2:
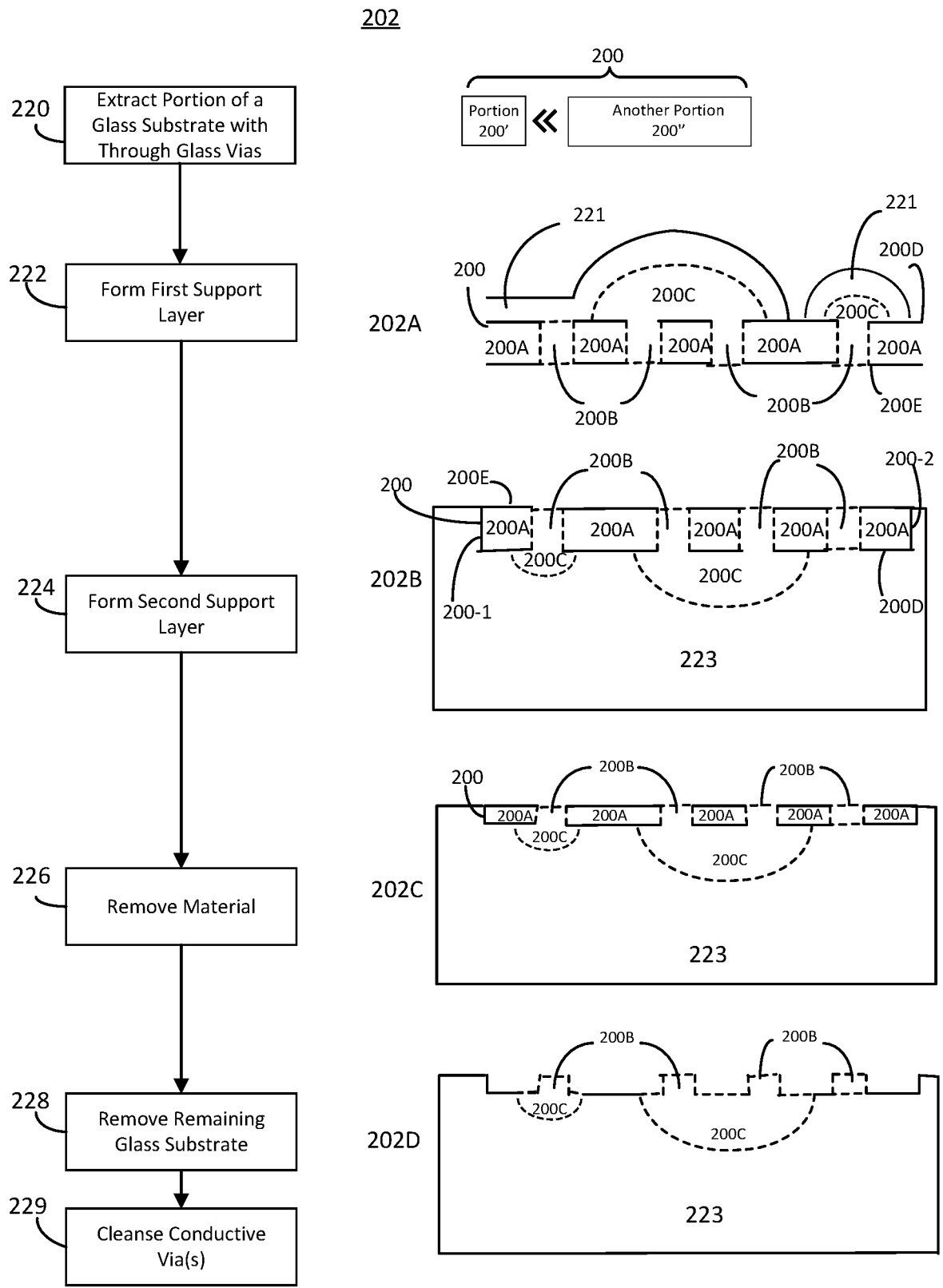

Embodiments of the present invention can be more easily understood and further advantages and uses thereof more readily apparent, when considered in view of the description of the preferred embodiments and the following figures in which:

FIG. 1 illustrates one embodiment of a cross-section of a glass substrate with through glass vias; and FIG. 2 is a flow diagram illustrating one embodiment of a method of removing glass from a glass substrate with through glass vias.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Techniques are disclosed for removing a glass substrate surrounding conductive via(s) in the glass substrate. Through glass via(s) (TGV(s)) in a glass substrate may be created, e.g., by electroplating or another deposition process, a conductor in openings in a glass substrate. Thus, a through glass via is a conductive via (or a through glass conductive via).

As a result of such removal, the conductive via(s) are isolated from the glass substrate. In the absence of the surrounding glass substrate, testing can be performed on the isolated conductive via(s) without interference from the glass substrate which could affect test results. Optionally, such testing comprises compression and/or bending testing. Additionally and/or alternatively, the isolated conductive via(s) can have their morphologies, chemical composition, grain structures, and surface defects analyzed, e.g., by scanning electron microscopy (SEM), energy dispersive spectroscopy (EDS), and/or focused ion beam analysis. A focused ion beam can also be used to remove a portion of an isolated conductive via to obtain information about the internal structure, e.g., grain map and grain orientation using for example electron backscatter diffraction (EBSD) analysis. This would be difficult in the presence of the glass substrate because the glass substrate would absorb charge. By repeatedly removing portions of the isolated conductive via, three dimensional morphological, microstructural, and chemical information can be generated using SEM imaging, EBSD analysis, and EDS elemental mapping.

Glass is an amorphous material composed primarily of silicon and oxygen. Each conductive via is formed by filling an opening in the glass substrate with a conductor. The conductor may be a metal or a metal alloy, e.g., copper or gold. An opening may be a cylindrical volume, and thus has a corresponding circular and rectangular cross sections. However, if glass is removed with a process applied to one side of glass, e.g., using a chemical etch or laser oblation, then typically more glass will be removed closer to that side than the opposite side. As a result, the resulting opening has a volume that is a conical frustum, and thus has a corresponding circular and trapezoidal cross sections. Optionally, for a resulting asymmetrically shape conductive via (formed in a conical frustum opening), the conductive via may have a diameter of fifty microns and forty to forty five microns respectively at a first end and at a second end of the conductive via. Optionally, for a symmetrically shaped conducive via (formed in a cylinder), the conductive via may have a diameter of greater than or equal to forty microns. The forgoing illustrated diameters are provided for pedagogical purposes; the conductive via may have larger and/or smaller diameters.

FIG. 1 illustrates one embodiment of a cross-section of a glass substrate with through glass vias 100. The glass substrate with through glass vias 100 comprises a glass substrate 100A and conductive via(s) 100B. Optionally, in one embodiment, the glass substrate 100A may have a thickness (T) 100F of between 300 and 400 microns, e.g., 360 microns; however, the thickness 100F glass substrate 100A may be greater or less than this range. The via hole, and thus the conductive via 100B formed in the via hole, has a height equal to the thickness 100F of the glass substrate 100A. The glass substrate with through glass vias 100 has a top surface 100D (on which any overburden is located) and a bottom surface 100E from which the conductive via 100B is optionally grown from. As used herein, the top surface 100D is opposite to the bottom surface 100E. Optionally, the glass substrate 100A is Corning, Inc.'s EAGLE XG® Slim Glass product.

Optionally, the glass substrate with through glass vias 100 includes one or more overburdens 100C. An overburden 100C is excess conductor that is formed along with the conductive via(s) 100B, e.g., by electroplating; the overburden 100C is formed over one or more conductive vias 100B and the top surface 100D of the glass substrate. Optionally, the overburden 100C has a hemispherical or substantially hemispherical volume and a semi-circular or substantially semi-circular cross-section.

An exemplary method of removing glass, or a portion of the glass substrate 100A, from a glass substrate with through glass vias 100 will now be described. FIG. 2 is a flow diagram illustrating one embodiment of a method 202 of removing glass from a glass substrate with through glass vias. The blocks of the flow diagram have been arranged in a generally sequential manner for ease of explanation.

Optionally, in block 220, a coupon (or a portion) 200' of a glass substrate with through glass via(s) is extracted from the glass substrate with through glass via(s) 200. The portion 200' can be extracted from the glass substrate with through glass via(s) 200 by separating the portion 200', from another portion 200" of the glass substrate with through glass via(s) 200, by laser oblation and/or mechanical separation, e.g., using a saw. Optionally, in one embodiment, the portion 200' may be separated from the other portion 200" using a carbon dioxide laser with an output optical power of 1 milliWatt, emitting one thousand pulses per inch, and passing a beam of the laser over an edge of the portion at least one hundred times; for example, in alternative embodiments, the optical power can be increased and the pulse per inch and/or number of passes can be decreased. Upon performing block 220, then perform blocks 224, 226, and 228 on the extracted portion; if optional block 222 is performed, then perform block 222 on the extracted portion.

Optionally, in block 222, a first support layer 221 is formed over at least one surface of the glass substrate 200A and an exposed surface of a conductor of each conductive via 200B, or over the at least one surface of the glass substrate 200A and the exposed surface of the conductor of each conductive via 200B, and a surface of at least one overburden 200C. A cross section of the resulting structure 202A is illustrated in FIG. 2. A support structure must underlie the top surface 200D when analysis, e.g., mechanical testing, is performed on conductive via(s) from the bottom surface 200E. Typically, the support structure must be something other than a second support layer 223 because of the typical malleable nature of the typical second support layer 223. An overburden 200C can serve as the support structure. However, the first support layer 221 must be formed when an overburden 200C does not exist on the top surface 200D and over a conductive via 200B to be tested. Optionally, the first support layer 221 may be utilized even when an overburden 200C is on the top surface 200D and over the conductive via to be tested. The top surface 200D is opposite the bottom surface 200E. The first support layer 221 may be formed with a conductor, e.g., a metal or a metal alloy, deposited, e.g., by electroplating, chemical vapor deposition, laser metal deposition, and/or other deposition process. The first support layer 221 must adhere well through chemical bonding to the material forming each corresponding conductive via 200B, and preferably would have an elastic modulus equal to or greater than the material forming the conductive via 200B. For pedagogical reasons, FIG. 2 will not subsequently illustrate the use of the first support layer 221; however, the subsequent blocks illustrated by FIG. 2 could utilize the first support layer 221.

In block 224, a second support layer 223 is formed over at least one of:

(a) the at least one surface of the glass substrate 200A and the exposed surface of the conductor of each conductive via 200B, or over the at least one surface of the glass substrate 200A and the exposed surface of the conductor of each conductive via 200B, and a surface of at least one overburden 200C; and (b) the first support layer 221.

A cross section of the resulting structure 202B is illustrated in FIG. 2. For pedagogical purposes, the illustrated resulting structure 202B places the second support layer 223 over the at least one surface of the glass substrate 200A and the exposed surface of the conductor of each conductive via 200B, and a surface of at least one overburden 200C. Optionally, the second support structure also covers a first side 200-1 and/or a second side 200-2 of the glass substrate with through glass via(s) 200 (or portion 200' thereof). The first side 200-1 and the second side are substantially perpendicular to the top surface 200D and the bottom surface 200E. Optionally, in block 224, the glass substrate 200A with through glass conductive via(s) 200B or the portion thereof is placed in a mounting mold, e.g., a cylindrical mounting mold, having an exposed opening; when placed in a mounting mold, a surface, e.g., the bottom surface 200E, is leveled with the bottom of the mounting mold. The top surface 200D of the glass substrate 200A with through glass conductive via(s) 200B or the portion thereof is exposed by the exposed opening of the mounting mold. The second support layer 223 is formed, e.g., poured over, the top surface 200D so that all of the bottom surface 200E remains exposed. The second support layer 223 is a material that is not removed in block 226 by the removal mechanism used in block 226. Optionally, the second support layer 223 is a polymer or prepolymer such as polyexpoide or an epoxy. Optionally, the polymer is formed with Allied High Tech Products, Inc.'s EpoxySet resin and hardener mixed with a respective 100:12 ratio. The glass substrate 200A with through glass conductive via(s) 200B, or the portion 200', and the second support layer 223 are removed from the mold. Optionally, before or after such removal, the mixture forming second support layer 223 is allowed to solidify or cure for some time, e.g., twenty four hours, at a temperature, e.g., room temperature.

Optionally, in block 226, material is removed from a surface of the glass substrate 200A with through glass conductive vias 200B, or the portion thereof, in or on the second support layer 223 and that is not covered by the second support layer 223. The removed material includes a portion of each of glass and conductor (of the glass substrate 200A with through glass conductive via(s) 200B), and optionally a portion of material forming the second support layer 223. Block 226 may not be required if, for example, the aspect ratio of height to diameter of the conductive via is not too great for analysis, e.g., for example for compression testing so that buckling will not occur. Block 226 may not be performed if a morphology analysis of an entire cross section (from top surface 200D to bottom surface 200E) is desired. A cross section of the resulting structure 202C is illustrated in FIG. 2. Remaining material means the glass substrate 200A with through glass conductive via(s) 200B, or the portion thereof, that remains after the material removal. The top surface of the remaining material includes any overburdens and/or the first support layer; the bottom surface of the remaining material does not include any overburdens and/or the first support layer.

Optionally, such removal is performed by mechanical polishing, chemical mechanical polishing, and/or chemical etching. Optionally, in one embodiment, the exposed bottom surface 200E is mechanically ground with silicon carbide grit paper, e.g., having a 1200 grit size, to reduce the glass substrate thickness (and correspondingly a thickness of the conductive via(s) 200B in the glass substrate 200A). Optionally, such thicknesses are reduced by, e.g., thirty to fifty percent of their original thickness. Optionally, the remaining thickness is greater than or equal to twice the diameter widest diameter of the conductive via or twice the diameter of the via where it adjoins an overburden 200C. The remaining thickness, e.g., the conductive via height, is determined based upon whether the conductive via(s), remaining after removal, are susceptibility to buckling, e.g., during analysis, e.g., mechanical testing. Optionally, such mechanical grinding may be performed with Allied High Tech Products, Inc.'s MULTIPREP™ polishing system.

In block 228, remaining glass substrate, or glass, is removed from the remaining material. As a result, only the conductive via(s) 200B and the second support layer 223, and optionally any overburdens 200C (to the extent that they exist), remain. A cross section of the resulting structure 202D is illustrated in FIG. 2. Glass substrate removal may be accomplished with an etchant, e.g., hydrofluoric acid or hydrofluoric acid and nitric acid, which selectively etches the glass substrate but not any of the other material of the remaining material (e.g., the remaining second support layer and each remaining conductive via); the etchant should not react with the first support layer 221 (if it is used). Optionally, the hydrofluoric acid may be 38% diluted hydrofluoric acid. Optionally, removal may be accomplished by immersing the remaining material in the etchant or covering just a portion of the bottom surface of the remaining material, including the conductive via(s) to be tested, with the etchant (which may be deposited by pipette). Optionally after the removal block 228 is performed, in block 229, the conductive via(s) 200B and the second support layer 223, and optionally any overburdens 200C and/or any first support layer 221, may be cleansed to remove any glass residue. Such cleansing may be performed by utrasonicating the conductive via(s) 200B and the second support layer 223, and optionally any overburdens 200C, in an alcohol based solution, such as ethanol, e.g. for twenty to thirty minutes. Alternatively, the ultrasonication can be performed in water. However other cleaning techniques (including cleaning times) may be used.

EXEMPLARY EMBODIMENTS

Example 1 includes a method of preparing a glass substrate with at least one through glass conductive via to facilitate testing of a conductive via, comprising: forming a support layer over at least one surface of the glass substrate and an exposed surface of a conductor of each conductive via, or over the at least one surface of the glass substrate and the exposed surface of the conductor of each conductive via, and a surface of at least one overburden; and upon forming the support layer, removing the glass substrate from the glass substrate with at least one through glass conductive via.

Example 2 includes the method of Example 1, further comprising upon forming the support layer, then removing a portion of each of glass and conductor from a surface, of the glass substrate with at least one through glass conductive via, that is not covered by the support layer; wherein removing the glass substrate is performed after removing the portion of each of the glass and the conductor and comprises removing remaining glass substrate from the glass substrate with at least one through glass conductive via.

Example 3 includes the method of Example 2, wherein removing the portion of each of the glass and the conductor comprises removing the portion of each of the glass and the conductor using at least one of mechanical polishing, chemical mechanical polishing, and chemical etching.

Example 4 includes the method of any of Examples 1-3, further comprising, prior to forming the support layer, extracting a portion of the glass substrate with at least one through glass conductive via, and upon performing the extraction of the portion then performing, on the extracted portion, forming the support layer and removing the glass substrate.

Example 5 includes the method of any of Examples 1-4, further comprising forming another support layer over the at least one surface of the glass substrate and the exposed surface of the conductor of each conductive via, or over the at least one surface of the glass substrate and the exposed surface of the conductor of each conductive via, and the surface of at least one overburden; wherein forming the support layer comprises forming the support layer over at least one of: (a) the other support layer, and (b) the at least one surface of the glass substrate and the exposed surface of a conductor of each conductive via, or the at least one surface of the glass substrate and the exposed surface of the conductor of each conductive via, and the surface of at least one overburden.

Example 6 includes the method of any of Examples 1-5, wherein forming the support layer comprises forming the support layer over a first surface of the glass substrate with at least one through glass conductive via so that all of a second surface, opposite the first surface, remains exposed.

Example 7 includes the method of Example 6, wherein forming the support layer comprises forming a polymer or a prepolymer over the first surface.

Example 8 includes the method of any of Examples 1-7, further comprising, after removing the glass substrate, cleansing each conductive via and the support layer.

Example 9 includes the method of Example 8, wherein cleansing each conductive via and the support layer comprises utrasonicating each conductive via and the support layer in an alcohol based solution.

Example 10 includes the method of any of Examples 1-9, further comprising, prior to forming the support layer, extracting a portion of the glass substrate with that at least one through glass conductive via and performing forming the support layer and removing the glass substrate on the portion.

Example 11 includes the method of any of Examples 1-10, wherein removing the glass substrate comprises removing the glass substrate with an etchant.

Example 12 includes the method of Example 11, wherein removing the glass substrate with an etchant comprises removing the glass substrate with an acid.

Terms of relative position as used in this application are defined based on a plane parallel to the conventional plane or working surface of a material (e.g., a layer or a substrate), regardless of orientation. Terms such as "on," "higher," "lower," "over," "top," "bottom," and "under" are defined with respect to the conventional plane or working surface being on the top surface of a layer or substrate, regardless of orientation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of preparing a glass substrate with at least one through glass conductive via to facilitate testing of a conductive via, comprising:
    forming a support layer on all of at least one surface of the glass substrate and on an exposed surface of a conductor of each conductive via, or all of on the at least one surface of the glass substrate and on the exposed surface of the conductor of each conductive via, and on a surface of at least one overburden; and
    upon forming the support layer, removing all of the glass substrate from the glass substrate with the at least one through glass conductive via.

2. The method of claim 1, further comprising upon forming the support layer, then removing a portion of each of glass and conductor from a surface, of the glass substrate with the at least one through glass conductive via, that is not covered by the support layer;
    wherein removing all of the glass substrate is performed after removing the portion of each of the glass and the conductor.

3. The method of claim 2, wherein removing the portion of each of the glass and the conductor comprises removing the portion of each of the glass and the conductor using at least one of mechanical polishing, chemical mechanical polishing, and chemical etching.

4. The method of claim 1, further comprising, prior to forming the support layer, extracting a portion of the glass substrate with at least one through glass conductive via, and upon performing the extraction of the portion then performing, on the extracted portion, forming the support layer and removing the glass substrate.

5. The method of claim 1, further comprising forming another support layer over the at least one surface of the glass substrate and the exposed surface of the conductor of each conductive via, or over the at least one surface of the glass substrate and the exposed surface of the conductor of each conductive via, and the surface of at least one overburden;
    wherein forming the support layer comprises forming the support layer over at least one of: (a) the another support layer, and (b) the at least one surface of the glass substrate and the exposed surface of a conductor of each conductive via, or the at least one surface of the glass substrate and the exposed surface of the conductor of each conductive via, and the surface of at least one overburden.

6. The method of claim 1, wherein forming the support layer comprises forming the support layer over a first surface of the glass substrate with at least one through glass conductive via so that all of a second surface, opposite the first surface, remains exposed.

7. The method of claim 6, wherein forming the support layer comprises forming a polymer or a prepolymer over the first surface.

8. The method of claim 1, further comprising, after removing the glass substrate, cleansing each conductive via and the support layer.

9. The method of claim 8, wherein cleansing each conductive via and the support layer comprises utrasonicating each conductive via and the support layer in an alcohol based solution.

10. The method of claim 1, further comprising, prior to forming the support layer, extracting a portion of the glass substrate with the at least one through glass conductive via and performing forming the support layer and removing the glass substrate on the portion.

11. The method of claim 1, wherein removing the glass substrate comprises removing the glass substrate with an etchant.

12. The method of claim 11, wherein removing the glass substrate with the etchant comprises removing the glass substrate with an acid.

* * * * *